United States Patent
Nakajima et al.

(10) Patent No.: US 9,741,587 B2
(45) Date of Patent: Aug. 22, 2017

(54) SEMICONDUCTOR DEVICE AND SEMICONDUCTOR DEVICE MANUFACTURING METHOD

(71) Applicant: FUJI ELECTRIC CO., LTD., Kawasaki-shi (JP)

(72) Inventors: Tsunehiro Nakajima, Matsumoto (JP); Yoshikazu Takahashi, Matsumoto (JP); Norihiro Nashida, Nagano (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/205,596

(22) Filed: Jul. 8, 2016

(65) Prior Publication Data

US 2017/0053871 A1 Feb. 23, 2017

(30) Foreign Application Priority Data

Aug. 18, 2015 (JP) ................. 2015-161392

(51) Int. Cl.
| | |
|---|---|
| *H01L 23/528* | (2006.01) |
| *H01L 25/00* | (2006.01) |
| *H01L 21/321* | (2006.01) |
| *H01L 23/492* | (2006.01) |
| *H01L 25/065* | (2006.01) |
| *H01L 21/283* | (2006.01) |
| *H01L 23/00* | (2006.01) |
| *H01L 23/373* | (2006.01) |
| *H01L 23/482* | (2006.01) |

(Continued)

(52) U.S. Cl.
CPC ...... *H01L 21/32115* (2013.01); *H01L 21/283* (2013.01); *H01L 21/6835* (2013.01); *H01L 21/6836* (2013.01); *H01L 23/3735* (2013.01); *H01L 23/482* (2013.01); *H01L 23/492* (2013.01); *H01L 24/24* (2013.01); *H01L 24/34* (2013.01); *H01L 25/0652* (2013.01);

(Continued)

(58) Field of Classification Search
CPC ........ H01L 23/482–23/50; H01L 24/34–24/41
See application file for complete search history.

(56) References Cited

U.S. PATENT DOCUMENTS

| | | |
|---|---|---|
| 7,045,441 B2 | 5/2006 | Chang et al. |
| 2002/0109152 A1 | 8/2002 | Kobayashi et al. |

(Continued)

FOREIGN PATENT DOCUMENTS

| | | |
|---|---|---|
| JP | H07-202066 A | 8/1995 |
| JP | 2000-022057 A | 1/2000 |

(Continued)

*Primary Examiner* — Daniel Shook
(74) *Attorney, Agent, or Firm* — Manabu Kanesaka (57) ABSTRACT

Provided are a semiconductor device manufacturing method and semiconductor device such that manufacturing can be simplified and the thickness of the semiconductor device can be reduced. The semiconductor device includes an insulated circuit substrate having on one main surface thereof a first metal layer and a second metal layer, a metal plate conductively connected to the first metal layer, a first semiconductor element including on front and rear surfaces thereof a plurality of metal electrodes, a first insulating member disposed on a side surface of the first semiconductor element, a second insulating member disposed on the first insulating member and on the first semiconductor element, and a third metal layer, in which at least one portion thereof is disposed on the second insulating member and which conductively connects the metal electrode of the first semiconductor element and the second metal layer on the insulated circuit substrate.

9 Claims, 10 Drawing Sheets (51) Int. Cl.
 *H01L 21/683* (2006.01)
 *H01L 23/498* (2006.01)
(52) U.S. Cl.
 CPC ........ *H01L 25/50* (2013.01); *H01L 23/49811* (2013.01); *H01L 2221/6834* (2013.01); *H01L 2221/68327* (2013.01); *H01L 2224/24137* (2013.01)

(56) References Cited

U.S. PATENT DOCUMENTS

2006/0108601 A1  5/2006  Okamoto
2014/0167237 A1* 6/2014  Yoo ......................... H01L 24/73
                                                          257/676

2014/0220765 A1  8/2014  Nakajima
2015/0109738 A1  4/2015  Yamada et al.

FOREIGN PATENT DOCUMENTS

| | | |
|---|---|---|
| JP | 2002-203942 A | 7/2002 |
| JP | 2006-179856 A | 7/2006 |
| JP | 2008-124158 A | 5/2008 |
| JP | 2009-076703 A | 4/2009 |
| JP | 2010-118533 A | 5/2010 |
| JP | 2012-138629 A | 7/2012 |
| JP | 2014-216555 A | 11/2014 |
| JP | 2015-002306 A | 1/2015 |
| WO | 2011/083737 A1 | 7/2011 |
| WO | 2013/058222 A1 | 4/2013 |
| WO | 2013/065316 A1 | 5/2013 |

* cited by examiner

SEMICONDUCTOR DEVICE AND SEMICONDUCTOR DEVICE MANUFACTURING METHOD

BACKGROUND OF THE INVENTION

1. Field of the Invention

The present invention relates to a semiconductor device and semiconductor device manufacturing method, wherein the manufacturing method is simplified.

2. Description of the Background Art

The structures of JP-A-2009-76703 and International Publication No. 2011/83737 are known as literature relating to a semiconductor device.

JP-A-2009-76703 discloses a structure wherein a semiconductor element has an electrode on each of front and back surfaces thereof and, in order to prevent an increase in electrical resistance due to deterioration of an aluminum electrode film formed as the front surface electrode, and detachment of aluminum wire, a nickel film is formed as a metal protective film on the aluminum electrode film. Also, JP-A-2009-76703 discloses a structure wherein the back surface electrode is joined with solder to a conductor layer forming an electrical circuit pattern of a DBC substrate. Also, JP-A-2009-76703 discloses a wiring structure wherein the front surface electrode is an emitter electrode of an IGBT module, and aluminum wire is joined to the emitter electrode, over the nickel film, using thermocompression or ultrasonic vibration.

International Publication No. 2011/83737 discloses a single-body unit formed of a copper block, an insulating substrate with a conductive pattern, an IGBT chip and diode chip, a collector terminal pin, an implant pin fixed with solder to the chip, a printed circuit board to which the implant pin is fixed, an emitter terminal pin and control terminal pin, a collector terminal pin, and a resin case in which the above are sealed.

Also, JP-A-2014-216555 discloses a semiconductor device manufacturing method including a step of bonding a monocrystalline first layer of a semiconductor to a surface of a support substrate, a defect introduction step of introducing a point defect into the first layer, and a heat treatment step of carrying out heat treatment on the support substrate to which is bonded the first layer into which the point defect has been introduced.

JP-A-2009-76703 has a problem in that, as wire deflection thickness is necessary in order to allow wire bonding, the thickness of a semiconductor device increases. Also, as it is necessary to increase the number of wire connections when the semiconductor device output increases, there is a problem in that the manufacturing process is troublesome.

International Publication No. 2011/83737 has a problem in that, as a circuit substrate and a large number of terminals forming a circuit are included above a semiconductor element, there are a large number of parts, and the manufacturing process is troublesome.

Taking the heretofore described problems into consideration, an object of the invention is to provide a semiconductor device and semiconductor device manufacturing method such that the manufacturing method is simplified, and the semiconductor device is thin.

SUMMARY OF THE INVENTION

In order to achieve the heretofore described object, a semiconductor device of one aspect of the invention includes an insulated circuit substrate having on one main surface thereof a first metal layer and a tenth metal layer, a metal plate conductively connected to the first metal layer, a first semiconductor element including on a surface thereof a multiple of metal electrodes, a first insulating member disposed on a side surface of the first semiconductor element, a second insulating member disposed on the first insulating member and on the first semiconductor element, and a sixth metal layer in which at least one portion is disposed on the second insulating member and which conductively connects the metal electrode of the first semiconductor element and the tenth metal layer on the insulated circuit substrate.

In the semiconductor device of the one aspect of the invention, the metal plate has a first through hole, at least one of the metal electrodes of the first semiconductor element is disposed in a position blocking the first through hole, and a fifth metal layer that conductively connects the semiconductor element and the first metal layer is disposed inside the first through hole.

In the semiconductor device of the one aspect of the invention, a thickness of the sixth metal layer is 10 μm or more, 200 μm or less.

In the semiconductor device of the one aspect of the invention, the sixth metal layer includes at least one type of element selected from a group formed of copper, aluminum, titanium, tungsten, nickel, carbon, gold, and silver, or is an alloy including these elements.

In the semiconductor device of the one aspect of the invention, a thickness of the second insulating member on the first semiconductor element is 10 μm or more, and 200 μm or less.

In the semiconductor device of the one aspect of the invention, the second insulating member is a polyimide resin.

In the semiconductor device of the one aspect of the invention, the sixth metal layer is conductively connected to the tenth metal layer across a terminal connecting metal plate.

In the semiconductor device of the one aspect of the invention, the metal plate includes a multiple of first through holes, the semiconductor device further includes a second semiconductor element including on a surface thereof a multiple of metal electrodes, wherein at least one of the metal electrodes is disposed in a position blocking the first through hole, and the sixth metal layer is directly connected to each of the metal electrode of the first semiconductor element and another metal electrode of the second semiconductor element.

The semiconductor device of the one aspect of the invention may include a third insulating member disposed on the sixth metal layer, a third semiconductor element disposed on the third insulating member and including on an upper surface thereof a multiple of metal electrodes, a fourth insulating member disposed on the third semiconductor element and covering a surface of the third semiconductor element on which the metal electrode is not formed, an eighth metal layer that directly conductively connects the metal electrode of the third semiconductor element and the sixth metal layer across the third insulating member and the fourth insulating member, and a ninth metal layer that directly conductively connects the metal electrode of the third semiconductor element and the metal electrode of the first semiconductor element across the second insulating member, the third insulating member, and the fourth insulating member.

A semiconductor device manufacturing method of one aspect of the invention sequentially includes a semiconductor element preparation step of preparing a first semiconductor element on which are formed a multiple of metal electrodes, a step of covering a surface of the first semiconductor element on which the metal electrode is not formed with a second insulating member, and a step of forming a sixth metal layer that conductively connects the metal electrode of the first semiconductor element and a tenth metal layer on an insulated circuit substrate across the second insulating member.

In the semiconductor device manufacturing method of the one aspect of the invention, the sixth metal layer is formed by spraying metal.

The semiconductor device manufacturing method of the one aspect of the invention may include, before the step of covering the surface of the first semiconductor element on which the metal electrode is not formed with the second insulating member, a step of disposing a metal electrode of the first semiconductor element so as to block a first through hole of a metal plate a spraying step of spraying metal onto the metal electrode of the first semiconductor element from the first through hole in a surface of the metal plate on a side opposite to a surface on the first semiconductor element side, and a polishing step of polishing a surface of the sprayed metal.

The semiconductor device manufacturing method of the one aspect of the invention may sequentially include, before the polishing step, a step of disposing a first insulating member that fixes the metal plate and the first semiconductor element in a position on the metal plate in which the first semiconductor element is not disposed, and a step of covering with protective tape a surface of the first semiconductor element and the first insulating member opposite to a side facing the metal plate.

The semiconductor device manufacturing method of the one aspect of the invention may include a step of directly joining the polished surface of the metal and a first metal layer on the insulated circuit substrate.

According to the semiconductor device and semiconductor device manufacturing method according to the invention, advantages are achieved in that manufacture of the semiconductor device can be simplified, and the thickness of the semiconductor device can be reduced.

DETAILED DESCRIPTION OF THE INVENTION

Hereafter, referring to the attached drawings, a detailed description will be given of preferred embodiments of a semiconductor device and semiconductor device manufacturing method according to the invention. In the following description of the embodiments and in the attached drawings, the same reference signs are allotted to identical configurations, and redundant descriptions are omitted. The invention is not limited to the embodiments, and can be appropriately modified and implemented within a range that does not deviate from the scope of the invention. Also, not all combinations of characteristics described in the embodiments are necessarily essential for the solution to the problems in the invention. Regarding the material of a wafer used in the manufacture of a semiconductor element, the semiconductor element may be manufactured from any one type of semiconductor wafer selected from a group consisting of silicon, silicon carbide, and gallium nitride.

First Embodiment

A description will be given of a first embodiment according to the invention. FIGS. 1A to 1F, 2A to 2F, 3A to 3E, 5A to 5D, and 6A to 6D are sectional views illustrating a semiconductor device manufacturing method according to the first embodiment of the invention. FIG. 4 is a bottom view of a metal plate of a semiconductor device according to the first embodiment of the invention. A semiconductor device 20 according to the first embodiment of the invention includes an insulated circuit substrate 40 having a first metal layer 2 and tenth metal layer 23 on one main surface thereof, a metal plate 5 conductively connected to the first metal layer 2, a first semiconductor element 7 including a multiple of metal electrodes 7c on a surface thereof, a first insulating member 8 disposed on a side surface of the first semiconductor element 7, a second insulating member 9 disposed on the first insulating member 8 and on the first semiconductor element 7, and a sixth metal layer 11a in which at least one portion is disposed on the second insulating member 9 and which conductively connects the metal electrode 7c of the first semiconductor element 7 and the tenth metal layer 23 on the insulated circuit substrate 40 (refer to FIG. 6Y1). Furthermore, in the semiconductor device 20, the metal plate 5 has a first through hole 5a, at least one of the metal electrodes 7c of the first semiconductor element 7 is disposed in a position blocking the first through hole 5a, and a fifth metal layer 6 that conductively connects the first semiconductor element 7 and first metal layer 2 is disposed inside the first through hole 5a.

The thickness of the sixth metal layer 11a of the semiconductor device 20 is preferably such that the greater the output of the semiconductor device, the greater the thickness of the sixth metal layer 11a. For example, the thickness of the sixth metal layer 11a may be 10 µm or more, and 200 µm or less. More desirably, the thickness of the sixth metal layer 11a is 50 μm or more, and 80 μm or less. For example, when a current of 20 A is caused to flow through the sixth metal layer 11a with a length of 20 mm and a width of 2 mm, there is a problem in that the possibility of melting increases when the thickness is less than 10 μm. When the thickness exceeds 200 μm, there is a problem in that time is needed to manufacture the sixth metal layer 11a.

The sixth metal layer 11a includes at least one type of element selected from a group consisting of copper, aluminum, titanium, tungsten, nickel, carbon, gold, and silver, or may be an alloy including these elements. In the first embodiment, copper is used for the sixth metal layer 11a.

The thickness of the second insulating member 9 on the first semiconductor element 7 and the thickness on a second semiconductor element 16 may be 10 μm or more, and 200 μm or less. More desirably, the thickness of the second insulating member 9 may be 30 μm or more, and 50 μm or less. When the thickness is less than 10 μm, coating evenly is difficult. When the thickness exceeds 200 μm, the difference in thermal stress with the semiconductor element increases, and there is a possibility of the second insulating member 9 becoming easily detached. A specific component of the second insulating member may be a polyimide resin. The second insulating member 9 may cover an outer edge of the metal electrode 7c of the first semiconductor element 7 and an outer edge of a metal electrode 16c of the second semiconductor element 16. Also, the second insulating member 9 desirably covers the upper surface of an unshown voltage withstanding structure portion on an outer edge of the first semiconductor element 7 and the upper surface of an unshown voltage withstanding structure portion on an outer edge of the second semiconductor element 16.

The sixth metal layer 11a may be conductively connected to the tenth metal layer 23 across a terminal connecting metal plate 13, or the terminal connecting metal plate 13 may be omitted, and the sixth metal layer 11a and tenth metal layer 23 may be directly conductively connected.

The metal plate 5 includes a multiple of the first through hole 5a, and further includes the second semiconductor element 16 that includes a multiple of the metal electrode 16c on a surface thereof, wherein at least one of the metal electrodes 16c is disposed in a position blocking the first through hole 5a, and a seventh metal layer 11b may be directly connected to each of the metal electrode 7c of the first semiconductor element 7 and another metal electrode 16c of the second semiconductor element 16.

FIG. 4 is a bottom view of the metal plate 5. The first through hole 5a of the metal plate 5 is smaller than the first semiconductor element 7 and second semiconductor element 16. Furthermore, the metal plate 5 includes a second through hole 5b. A screw groove is formed in the inner periphery of the second through hole 5b. A screw groove that meshes with the screw groove in the inner periphery of the second through hole 5b is formed in the lower end of a metal terminal 12b, to be described hereafter.

Next, a description will be given of the semiconductor device manufacturing method of the first embodiment according to the invention.

Figure 1A:
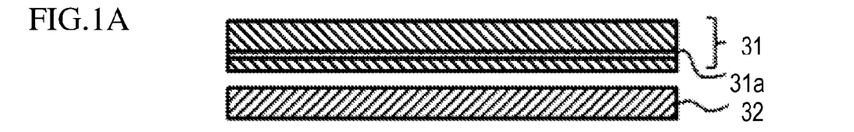
FIGS. 1A to 1F are sectional views according to a semiconductor device manufacturing method according to a first embodiment of the invention.

FIGS. 1A to 1F and 2A to 2F illustrate a method of manufacturing a semiconductor element (a semiconductor element preparation step). As shown in FIG. 1A, a monocrystalline silicon carbide wafer 31 wherein protons have been implanted into one surface, and a polycrystalline silicon carbide wafer 32 wherein a void is formed in the front surface, are prepared. Avoid forming method is described in paragraphs 0053 and 0054 of Japanese Patent No. 5,725,430. For example, a void can be formed in the whole or one portion of the front surface of the polycrystalline silicon carbide wafer 32 by irradiation with plasma. In a proton implantation region 31a, the proton concentration is desirably $1 \times 10^{16}$ ions/cm$^2$ or more, $5 \times 10^{17}$ ions/cm$^2$ or less.

Figure 1B:
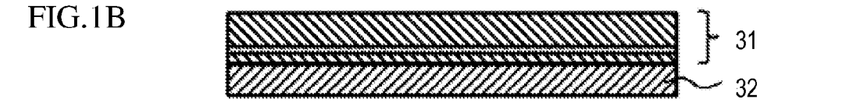

Next, as shown in FIG. 1B, the monocrystalline silicon carbide wafer 31 disposed so that the proton implantation region 31a is on the polycrystalline silicon carbide wafer 32 side, and the polycrystalline silicon carbide wafer 32 are directly joined using a surface-activated room-temperature bonding (SAB) device (Musashino Engineering Co., Ltd.). The direct joining is carried out by the wafers being brought into contact in an ultra-high vacuum at room temperature after the joining surface of each wafer is cleaned using an argon beam. At this time, it is more desirable that pressure is applied between the members. For example, pressure of 0.1 MPa or more, 10 MPa or less is desirable.

Figure 1C:
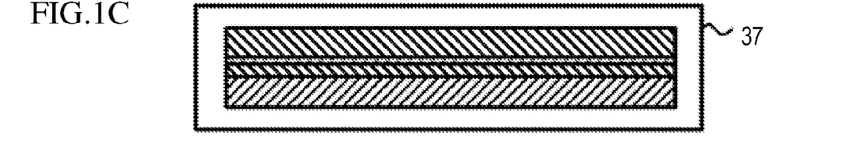
Figure 1D:
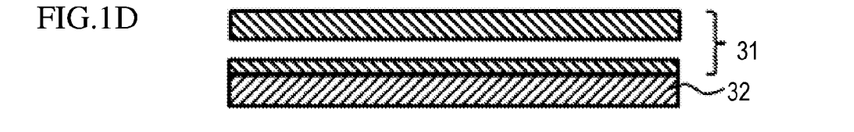

Next, as shown in FIG. 1C, the heretofore described two wafers are placed in a heating furnace 37 and heated in an inert gas atmosphere at 600° C. or more, and 1,200° C. or less, thereby causing the monocrystalline silicon carbide wafer 31 and polycrystalline silicon carbide wafer 32 to separate. A state after detachment is shown in FIG. 1D. A crack spreads in the proton implantation region 31a of the monocrystalline silicon carbide wafer 31 due to the heating, whereby a monocrystalline silicon carbide film becomes detached from the monocrystalline silicon carbide wafer 31. Further, the monocrystalline silicon carbide film is transferred to the front surface of the polycrystalline silicon carbide wafer 32. The thickness of the transferred monocrystalline silicon carbide film is approximately 1 μm to 30 μm. The depth of the proton implantation can be changed to become the thickness of the target monocrystalline silicon carbide film by adjusting the proton accelerating voltage.

Figure 1E:
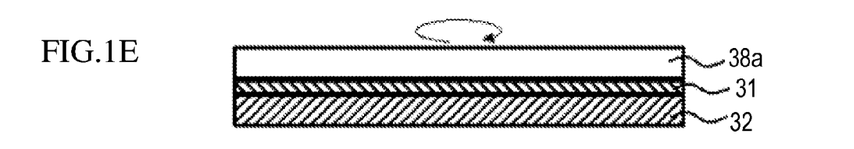

Next, as shown in FIG. 1E, chemical mechanical polishing (CMP) is carried out on the front surface of the monocrystalline silicon carbide film using a grindstone 38a.

Figure 1F:
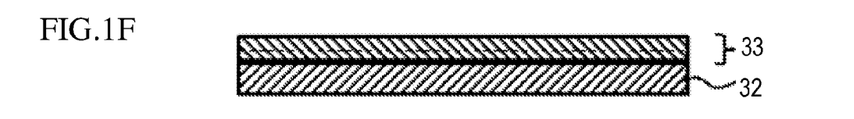

Next, as shown in FIG. 1F, a monocrystalline silicon carbide film 33 is formed by epitaxially growing monocrystalline silicon carbide on the front surface of the polished monocrystalline silicon carbide film.

Figure 2A:
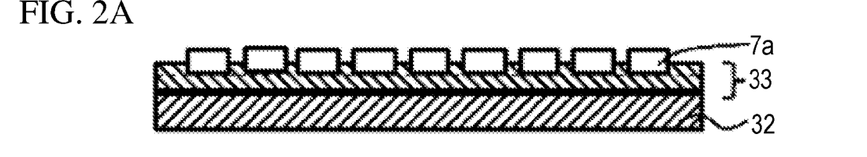
FIGS. 2A to 2F are sectional views according to the semiconductor device manufacturing method according to the first embodiment of the invention.

Next, as shown in FIG. 2A, a semiconductor element upper structure 7a is formed on the front surface of the epitaxially grown monocrystalline silicon carbide film 33.

Figure 2B:
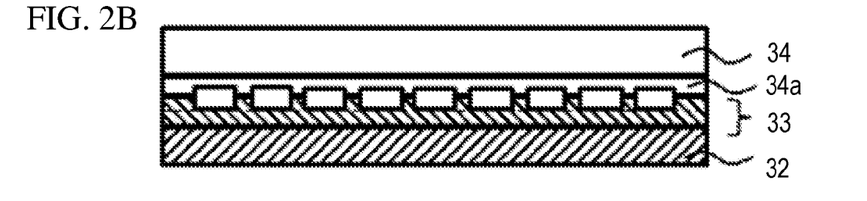

Next, as shown in FIG. 2B, a support member 34 is fixed across an adhesive 34a to the surface of the monocrystalline silicon carbide film 33 on which the semiconductor element upper structure 7a is formed.

Figure 2C:
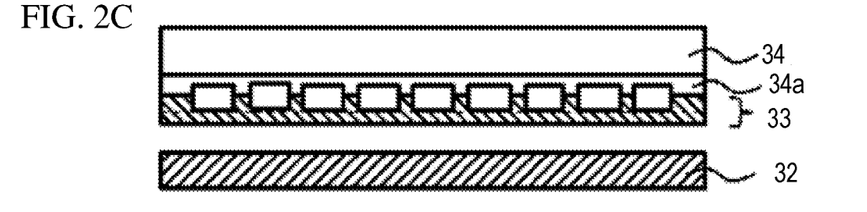

Next, as shown in FIG. 2C, the outer periphery of the interface between the monocrystalline silicon carbide film 33 and polycrystalline silicon carbide wafer 32 is irradiated with a laser beam, thereby causing the monocrystalline silicon carbide film 33 and polycrystalline silicon carbide wafer 32 to separate at the interface, with one portion of the outer periphery of the wafer as an origin. The wafer is irradiated with the laser beam from a wafer side surface direction or a vertical direction. A detailed method is described in paragraphs 0046 to 0051 of Japanese Patent No. 5,725,430.

Figure 2D:
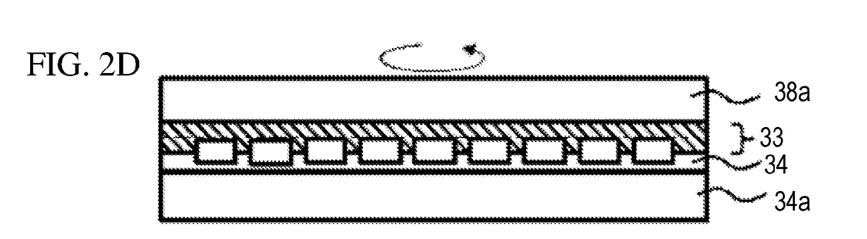

Next, as shown in FIG. 2D, the wafer is inverted, and chemical mechanical polishing is carried out on the back surface of the monocrystalline silicon carbide film 33 using the grindstone 38a.

Figure 2E:
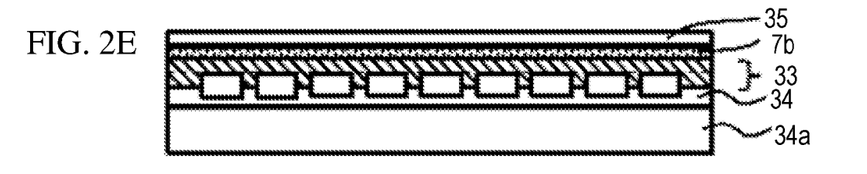

Next, as shown in FIG. 2E, a semiconductor element lower structure 7b is formed on the back surface of the monocrystalline silicon carbide film 33. The semiconductor element upper structure 7a and semiconductor element lower structure 7b are changed as appropriate in accordance with the type of semiconductor element to be manufactured. For example, the semiconductor element 7 can be an insulated gate bipolar transistor (IGBT), while the semiconductor element 16 can be a Schottky barrier diode (SBD). Further, dicing tape 35 is attached to the front surface of the semiconductor element lower structure 7b.

Figure 2F:
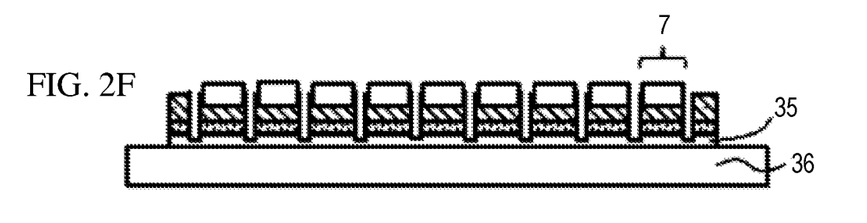

Next, as shown in FIG. 2F, the wafer is inverted, and the other surface of the dicing tape 35 is attached to a dicing tray 36. Then, dicing is carried out between the semiconductor element structures, thereby manufacturing the semiconductor element.

FIGS. 3A to 3E illustrate a method of manufacturing a semiconductor element composite body 15 (a step of disposing a metal electrode of a first semiconductor element so as to block a first through hole of a metal plate).

Figure 3A:
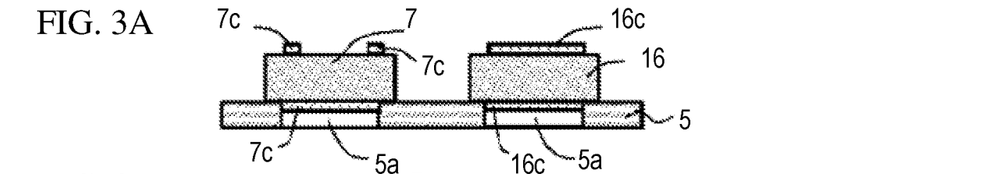
FIGS. 3A to 3E are sectional views according to the semiconductor device manufacturing method according to the first embodiment of the invention.
Figure 4:
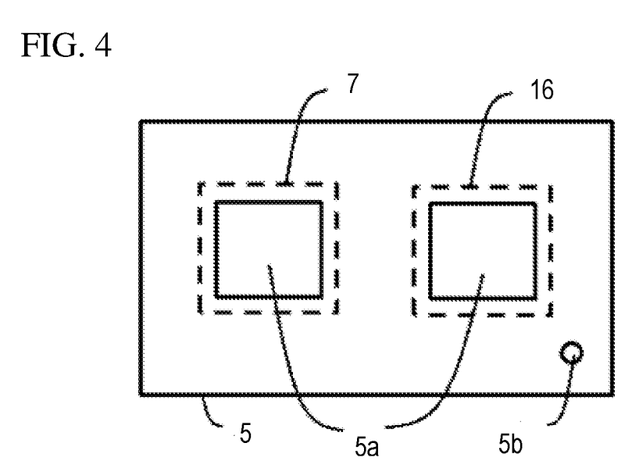
FIG. 4 is a bottom view of a metal plate of a semiconductor device according to the first embodiment of the invention.

As shown in FIG. 3A, the semiconductor element 7 and semiconductor element 16 manufactured in FIG. 2F are disposed so as to cover the first through hole 5a of the metal plate 5. At this time, the semiconductor element 7 and semiconductor element 16 are disposed in positions blocking the first through hole 5a with lower surface metal electrodes 7c and 16c. The metal electrodes 7c and 16c are formed when forming the semiconductor element upper structure 7a and semiconductor element lower structure 7b in FIGS. 2A and 2E. The thickness of the semiconductor element varies in accordance with the element breakdown voltage specification but, for example, when using a silicon wafer, the thickness is in the region of 60 μm to 80 μm in the case of a 600V breakdown voltage, and in the region of 120 μm to 150 μm in the case of a 1, 200V breakdown voltage. When using a silicon carbide wafer, a thickness approximately one-tenth of that when using a silicon wafer is sufficient. The thickness of the metal plate 5 is 1 mm or less. In the first embodiment, a metal plate with a thickness of 1 mm is used as the metal plate 5.

Figure 3B:
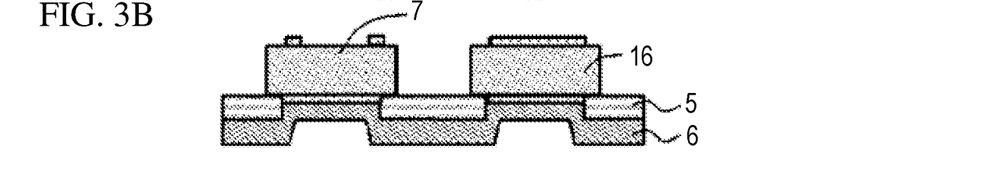

Next, as shown in FIG. 3B, metal is sprayed onto the metal electrode of the first semiconductor element from the first through hole in the surface of the metal plate 5 on the side opposite to the surface on the first semiconductor element 7 side (a spraying step).

Figure 3C:
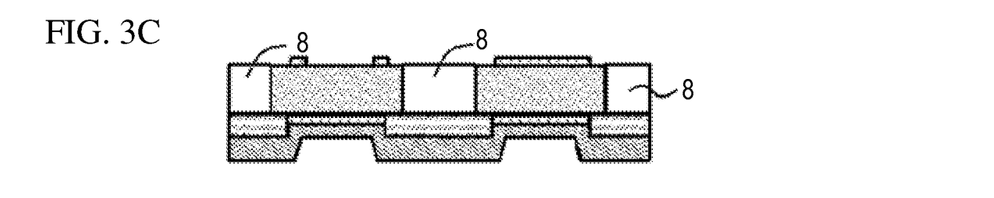

Next, as shown in FIG. 3C, the first insulating member 8 is disposed on side surfaces of the first semiconductor element 7 and second semiconductor element 16 on the metal plate 5, whereby the peripheries of the first semiconductor element and second semiconductor element are buried.

Figure 3D:
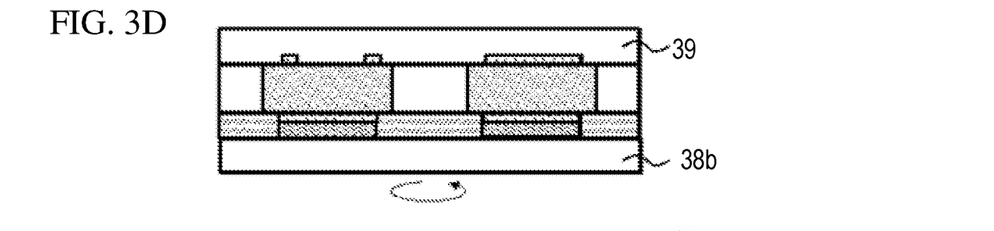
Figure 3E:
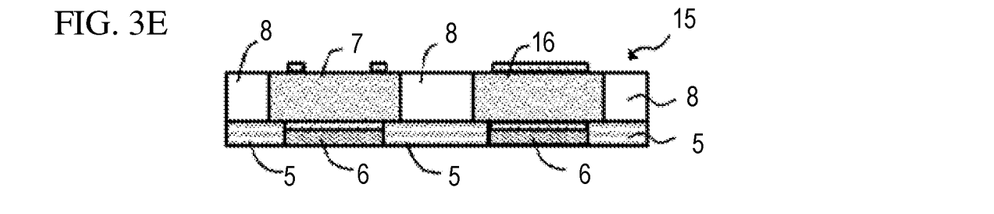

Next, as shown in FIG. 3D, a surface of the first semiconductor element 7 and the first insulating member 8 opposite to a side facing the metal plate is covered with a protective material 39 such as a polyimide tape, a glass, a Si wafer and so on. Then, the lower surface of the sprayed fifth metal layer 6 is polished using a grindstone 38b (a polishing step). FIG. 3E shows a structure of a semiconductor element composite body 15 after the polishing step. The lower surface of the fifth metal layer 6 and the surface of the metal plate 5 on the side opposite the surface on the first semiconductor element 7 side are flush.

Next, an insulated circuit substrate manufacturing method will be described using FIGS. 5A to 5D. A spraying method used in first, second, and third embodiments of the invention is as follows. An argon (Ar) gas is used as an atmosphere and carrier gas, and plasma-heated metal particles are sprayed onto a processing target. The spraying is carried out at room temperature.

Figure 5A:
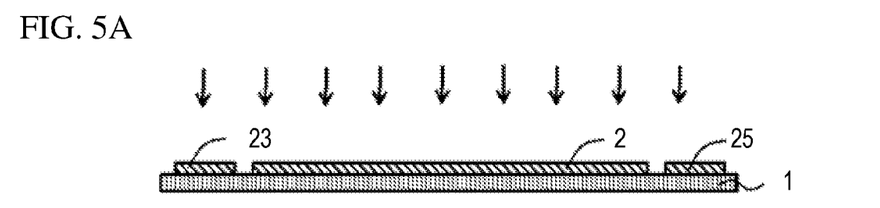
FIGS. 5A to 5D are sectional views according to the semiconductor device manufacturing method according to the first embodiment of the invention.

As shown in FIG. 5A, the first metal layer 2, the tenth metal layer 23, and an eleventh metal layer 25 are formed by spraying on the upper surface of an insulating substrate 1. The type of metal sprayed is desirably copper or a copper alloy.

Figure 5B:
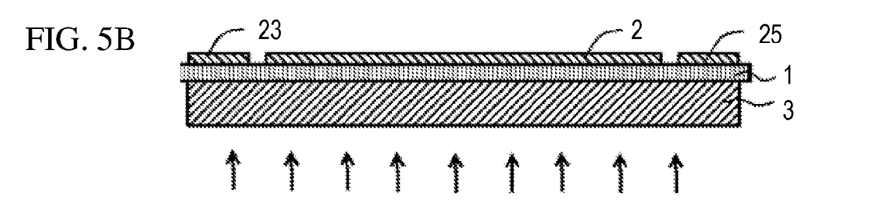

Next, as shown in FIG. 5B, a second metal layer 3 is formed by spraying on the lower surface of the insulating substrate 1. The type of metal sprayed is desirably copper or a copper alloy. The thickness of the second metal layer 3 is greater than that of the first metal layer 2, tenth metal layer 23, and eleventh metal layer 25. For example, the thickness of the first metal layer 2, tenth metal layer 23, and eleventh metal layer 25 is 1 mm or less.

Figure 5C:
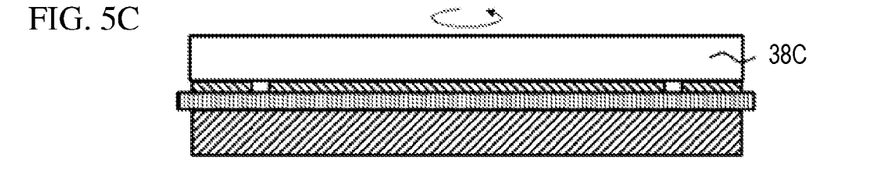

Next, as shown in FIG. 5C, the upper surface of the first metal layer 2, the upper surface of the tenth metal layer 23, and the upper surface of the eleventh metal layer 25 are polished using a grindstone 38c.

Figure 5D:
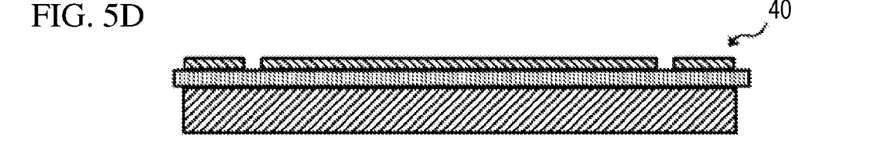

FIG. 5D shows the structure of the insulated circuit substrate 40 after the polishing step. The upper surface of the first metal layer 2, the upper surface of the tenth metal layer 23, and the upper surface of the eleventh metal layer 25 are flush.

Next, a method of manufacturing the semiconductor device 20 by assembling the semiconductor element composite 15, the insulated circuit substrate 40, and the like, will be described using FIGS. 6A to 6D.

Figure 6A:
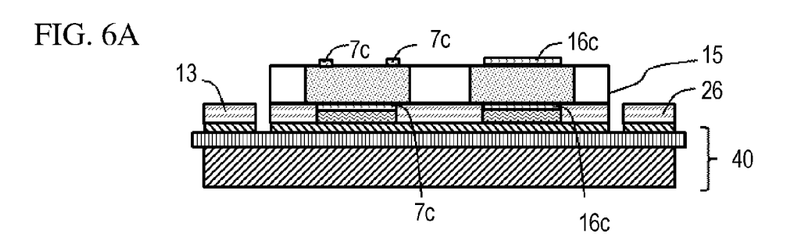
FIGS. 6A to 6D are sectional views according to the semiconductor device manufacturing method according to the first embodiment of the invention.

As shown in FIG. 6A, the lower surface of the fifth metal layer 6 of the semiconductor element composite 15 is joined to the upper surface of the first metal layer 2 of the insulated circuit substrate 40, the terminal connecting metal plate 13, whose lower surface has been polished, is joined to the upper surface of the tenth metal layer 23, and a terminal connecting metal plate 26, whose lower surface has been polished, is joined to the upper surface of the eleventh metal layer 25. Specifically, these parts are directly joined using a surface-activated room-temperature bonding (SAB) device (Musashino Engineering Co., Ltd.). The direct joining is carried out by contacting the parts in an ultra-high vacuum at room temperature after the joining surface of each part is cleaned using an argon beam. At this time, it is more desirable that pressure is applied between the members. For example, pressure of 0.1 MPa or more, and 10 MPa or less is desirable.

Figure 6B:
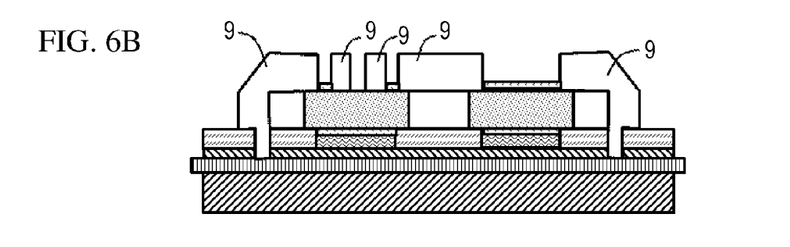

Next, as shown in FIG. 6B, the upper surface of the first semiconductor element 7 and the upper surface of the second semiconductor element 16 are covered with the second insulating member 9, leaving the surfaces on which the metal electrode 7c of the first semiconductor element 7 and the metal electrode 16c of the second semiconductor element 16 are formed. At this time, the second insulating member 9 buries the first insulating member 8, a groove between the first metal layer 2 and tenth metal layer 23, a space between the metal plate 5 and terminal connecting metal plate 13, one portion of the upper surface of the terminal connecting metal plate 13, a groove between the first metal layer 2 and eleventh metal layer 25, a space between the metal plate 5 and terminal connecting metal plate 26, and one portion of the upper surface of the terminal connecting metal plate 26.

Figure 6C:
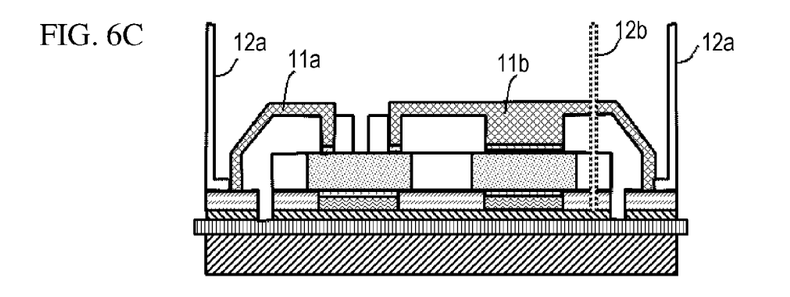

Next, as shown in FIG. 6C, the sixth metal layer 11a, which conductively connects the metal electrode 7c on the left side of the first semiconductor element 7 upper surface and the tenth metal layer 23 on the insulated circuit substrate 40, and the seventh metal layer 11b, which conductively connects the metal electrode 7c on the right side of the first semiconductor element 7 upper surface and the eleventh metal layer 25 on the insulated circuit substrate 40, are formed on the second insulating member 9.

The sixth metal layer 11a and seventh metal layer 11b are formed by spraying metal. The metal is desirably copper or a copper alloy. A screw groove is formed in the lower end of the metal terminal 12b. A hole penetrating the second insulating member 9 and first insulating member 8 is made by drilling in a region not covered by the seventh metal layer 11b, and the metal terminal 12b is screwed into the second through hole 5b of the metal plate 5, whereby the metal plate 5 and second through hole 5b are conductively connected.

Figure 6D:
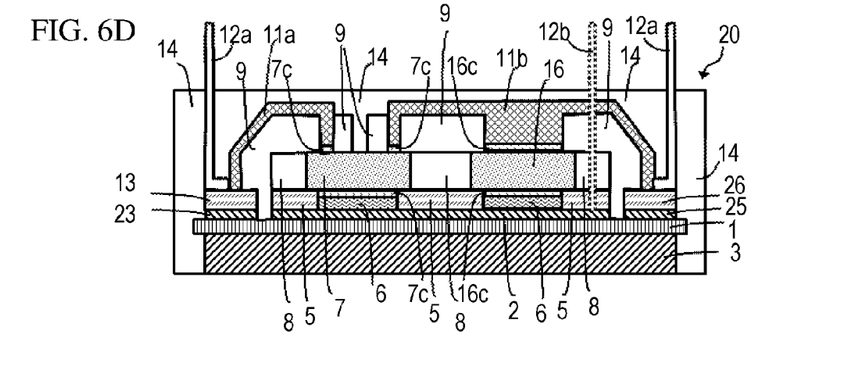

Next, as shown in FIG. 6D, the semiconductor device except for the upper ends of the metal terminals 12a and 12b and the lower surface of the second metal layer 3 is sealed with an insulating resin 14. In this way, the semiconductor device 20 is manufactured.

Second Embodiment

A description will be given of a second embodiment according to the invention. FIGS. 7A to 7C and 8A to 8D are sectional views illustrating a semiconductor device manufacturing method according to the second embodiment of the invention.

Figure 8A:
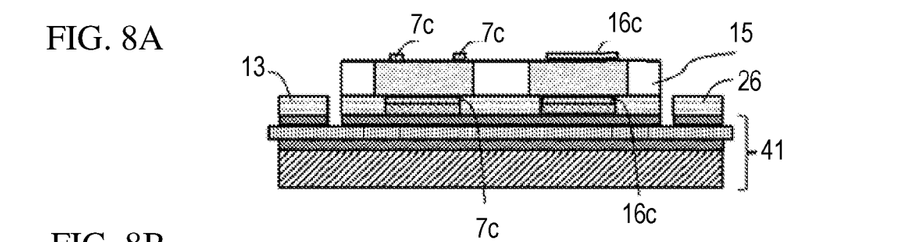
FIGS. 8A to 8D are sectional views according to the semiconductor device manufacturing method according to the second embodiment of the invention.
Figures 8B, 8C:
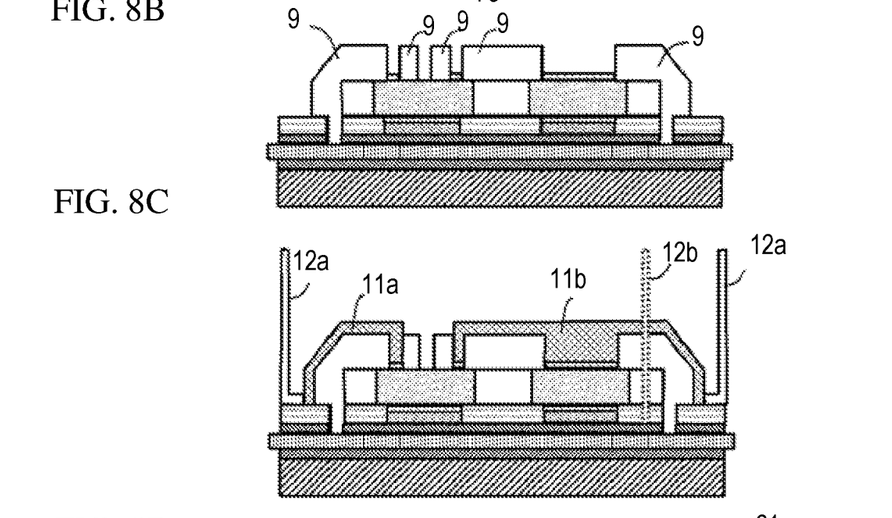
Figure 8D:
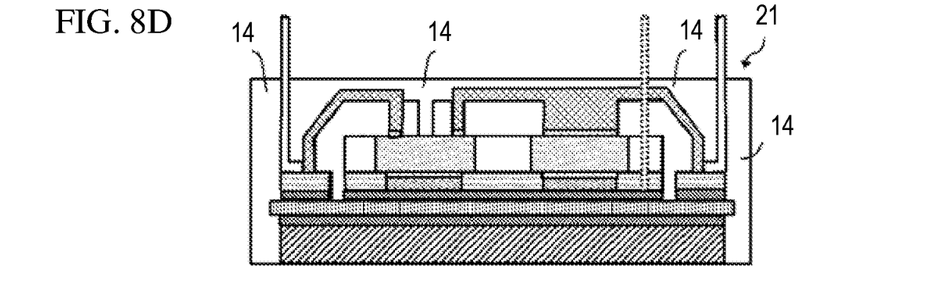

A semiconductor device 21 according to the second embodiment of the invention includes an insulated circuit substrate 41 having a tenth metal layer 23a, the metal plate 5 having the first through hole 5a disposed on one surface of the insulated circuit substrate 41, the first semiconductor element 7 including a multiple of metal electrodes 7c on a surface thereof, wherein at least one of the metal electrodes 7c is disposed in a position blocking the first through hole 5a, the second semiconductor element 16 including a multiple of metal electrodes 16c on a surface thereof, wherein at least one of the metal electrodes 16c is disposed in a position blocking the first through hole 5a, the first insulating member 8 disposed on a side surface of the first semiconductor element 7 and a side surface of the second semiconductor element 16, the second insulating member 9 disposed on the first insulating member 8 and on the first semiconductor element 7 and second semiconductor element 16, the sixth metal layer 11a in which at least one portion is disposed on the second insulating member 9 and which conductively connects the metal electrodes 7c of the first semiconductor element 7 and the tenth metal layer 23a on the insulated circuit substrate 41, and the seventh metal layer 11b, which conductively connects the metal electrodes 7c of the first semiconductor element 7 and metal electrodes 16c of the second semiconductor element 16 and the tenth metal layer 23a on the insulated circuit substrate 41 (refer to FIG. 8D).

The sixth metal layer 11a may be conductively connected to the tenth metal layer 23a across the terminal connecting metal plate 13, or the terminal connecting metal plate 13 may be omitted, and the sixth metal layer 11a and tenth metal layer 23a may be directly conductively connected.

In the same way, the seventh metal layer 11b may be conductively connected to the eleventh metal layer 25a across the terminal connecting metal plate 13, or the terminal connecting metal plate 13 may be omitted, and the seventh metal layer 11b and eleventh metal layer 25a may be directly conductively connected.

A difference from the first embodiment is in the insulated circuit substrate 41. In the semiconductor device 21 of the second embodiment, a first metal layer 2a, the tenth metal layer 23a, the eleventh metal layer 25a, and a third metal layer 3a are formed of metal foils. These metal foils are joined to the insulating substrate 1. Further, the second metal layer 3 formed by spraying is disposed on the lower surface of the third metal layer 3a (refer to FIGS. 7A to 7C). Configurations other than the above are the same as in the first embodiment.

Next, a description will be given of a semiconductor device manufacturing method of the second embodiment according to the invention.

Figure 7A:
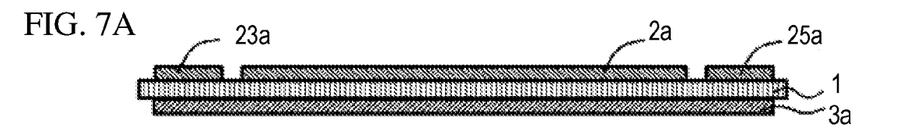
FIGS. 7A to 7C are sectional views according to a semiconductor device manufacturing method according to a second embodiment of the invention.

Firstly, as shown in FIG. 7A, the first metal layer 2a, tenth metal layer 23a, eleventh metal layer 25a, and third metal layer 3a are formed of metal foils on the insulating substrate 1.

Figure 7B:
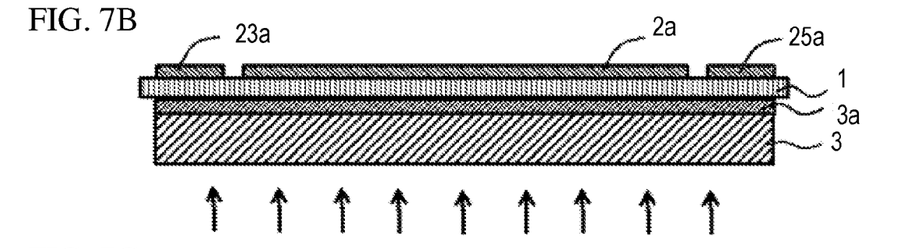
Figure 7C:
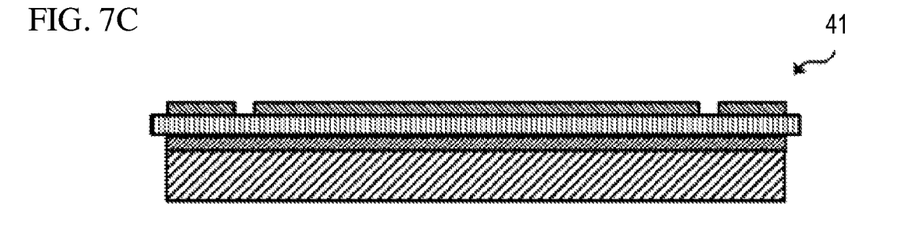

Next, as shown in FIG. 7B, the second metal layer 3 is formed by spraying on the lower surface of the third metal layer 3a. The structure of the fabricated insulated circuit substrate 41 is shown in FIG. 7C.

Next, a method of manufacturing the semiconductor device 21 by assembling the semiconductor element composite 15, the insulated circuit substrate 41, and the like, will be described using FIGS. 8A to 8D.

As shown in FIG. 8A, the lower surface of the fifth metal layer 6 of the semiconductor element composite 15 is joined to the upper surface of the first metal layer 2a of the insulated circuit substrate 41, the terminal connecting metal plate 13, whose lower surface has been polished, is joined to the upper surface of the tenth metal layer 23a, and the terminal connecting metal plate 26, whose lower surface has been polished, is joined to the upper surface of the eleventh metal layer 25. Specifically, these parts are directly joined using a surface-activated room-temperature bonding (SAB) device (Musashino Engineering Co., Ltd.). The direct joining is carried out by contacting the parts in an ultra-high vacuum at room temperature after the joining surface of each part is cleaned using an argon beam. At this time, it is more desirable that pressure is applied between the members. For example, pressure of 0.1 MPa or more, 10 MPa or less is desirable.

Next, as shown in FIG. 8B, the upper surface of the first semiconductor element 7 and the upper surface of the second semiconductor element 16 are covered with the second insulating member 9, leaving the surfaces on which the metal electrode 7c of the first semiconductor element 7 and the metal electrode 16c of the second semiconductor element 16 are formed. At this time, the second insulating member 9 buries the first insulating member 8, a groove between the first metal layer 2a and tenth metal layer 23a, a space between the metal plate 5 and terminal connecting metal plate 13, one portion of the upper surface of the terminal connecting metal plate 13, a groove between the first metal layer 2a and eleventh metal layer 25a, a space between the metal plate 5 and terminal connecting metal plate 26, and one portion of the upper surface of the terminal connecting metal plate 26.

Next, as shown in FIG. 8C, the sixth metal layer 11a, which conductively connects the metal electrode 7c on the left side upper surface of the first semiconductor element 7 and the tenth metal layer 23a on the insulated circuit substrate 41, and the seventh metal layer 11b, which conductively connects the metal electrode 7c on the right side upper surface of the first semiconductor element 7 and the eleventh metal layer 25a on the insulated circuit substrate 41, are formed on the second insulating member 9.

The sixth metal layer 11a and seventh metal layer 11b are formed by spraying metal. The metal is desirably copper or a copper alloy. A screw groove is formed in the lower end of the metal terminal 12b. A hole penetrating the second insulating member 9 and first insulating member 8 is made by drilling in a region not covered by the seventh metal layer 11b, and the metal terminal 12b is screwed into the second through hole 5b of the metal plate 5, whereby the metal plate 5 and second through hole 5b are conductively connected.

Next, as shown in FIG. 8D, the semiconductor device except for the upper ends of the metal terminals 12a and 12b and the lower surface of the second metal layer 3 is sealed with the insulating resin 14. In this way, the semiconductor device 21 is manufactured.

Third Embodiment

Figure 9:
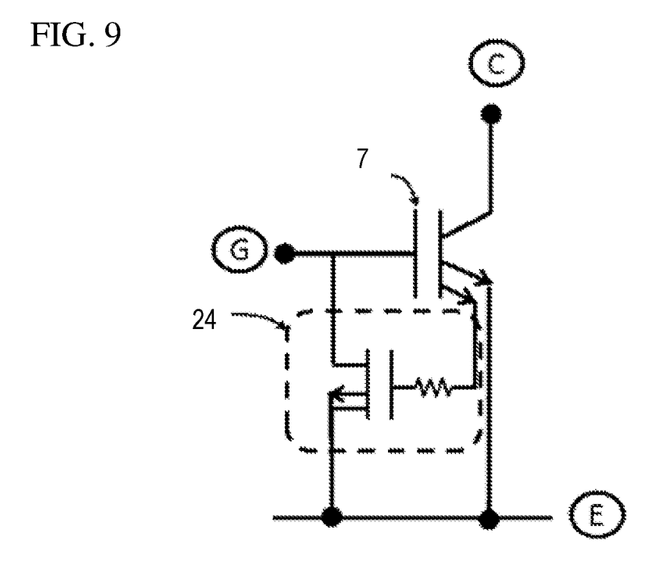
FIG. 9 is a circuit diagram of one portion of a semiconductor device according to a third embodiment of the invention.
Figure 10A:
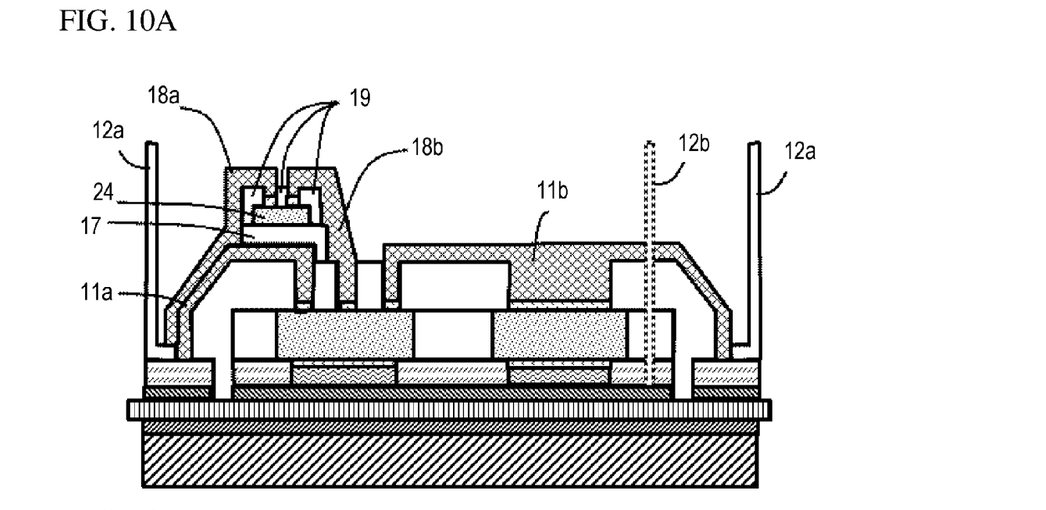
FIGS. 10A and 10B are sectional views according to a semiconductor device manufacturing method according to the third embodiment of the invention.
Figure 10B:
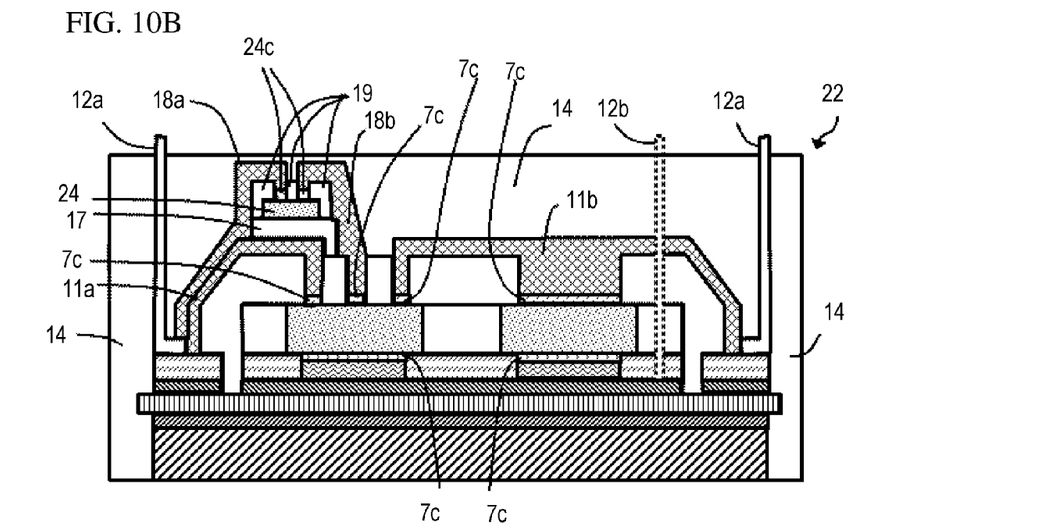

A description will be given of a third embodiment according to the invention. FIG. 9 is a circuit diagram of one portion of a semiconductor device 22. FIGS. 10A and 10B are sectional views illustrating a method of manufacturing the semiconductor device 22.

In the semiconductor device 22 according to the third embodiment of the invention, a subsequent structure is added to the semiconductor device 21 of the second embodiment. The semiconductor device 22 includes a third insulating member 17 disposed on the sixth metal layer 11a, a third semiconductor element 24 disposed on the third insulating member 17 and including a multiple of metal electrodes 24c on the upper surface thereof, a fourth insulating member 19 disposed on the third semiconductor element 24 and covering a surface on which the metal electrode 24c of the third semiconductor element 24 is not formed, an eighth metal layer 18a that directly conductively connects the metal electrode 24c of the third semiconductor element 24 and the sixth metal layer 11a across the third insulating member 17 and fourth insulating member 19, and a ninth metal layer 18b that directly conductively connects the metal electrode 24c of the third semiconductor element 24 and the metal electrode 7c of the first semiconductor element 7 across the second insulating member 9, third insulating member 17, and fourth insulating member 19 (refer to FIG. 10B). In the semiconductor device 22, the metal plate 5 has the first through hole 5a, at least one of the metal electrodes 7c of the first semiconductor element 7 is disposed in a position blocking the first through hole 5a, and the fifth metal layer 6 that conductively connects the first semiconductor element 7 and first metal layer 2 is disposed inside the first through hole 5a. In the second insulating member of the semiconductor device 22, an opening is disposed in a position in the center of the upper surface of the first semiconductor element 7, and the metal electrode 7c of the first semiconductor element 7 is disposed in the opening. For example, the third semiconductor element 24 is a semiconductor element for measuring current of the first semiconductor element 7.

Next, a description will be given of a semiconductor device manufacturing method of the third embodiment according to the invention.

Continuing from FIG. 8C, which is the second embodiment, the third insulating member 17 is disposed on the sixth metal layer 11a and on the second insulating member 9.

Next, the third semiconductor element 24 including the multiple of metal electrodes 24c on the upper surface thereof is disposed on the third insulating member 17.

Next, the fourth insulating member 19 is disposed on the third semiconductor element 24, covering the surface of the third semiconductor element 24 on which the metal electrode 24c is not formed.

Next, the eighth metal layer 18a and ninth metal layer 18b are formed. The eighth metal layer 18a directly conductively connects the metal electrode 24c of the third semiconductor element 24 and the sixth metal layer 11a across the third insulating member 17 and fourth insulating member 19. The ninth metal layer 18b directly conductively connects the metal electrode 24c of the third semiconductor element 24 and the metal electrode 7c of the first semiconductor element 7 across the second insulating member 9, third insulating member 17, and fourth insulating member 19.

Next, as shown in FIG. 10B, the semiconductor device except for the upper ends of the metal terminals 12a and 12b and the lower surface of the second metal layer 3 is sealed with the insulating resin 14. In this way, the semiconductor device 22 is manufactured.

As heretofore described, according to the semiconductor device and semiconductor device manufacturing method described in the first to third embodiments of the invention, manufacture of the semiconductor device can be simplified, and the thickness of the semiconductor device can be reduced.

The disclosure of Japanese Patent Application No. 2015-161392 filed on Aug. 18, 2015 is incorporated herein.

What is claimed is:

1. A semiconductor device, comprising:
   an insulated circuit substrate having on one main surface thereof a first metal layer and a second metal layer;
   a metal plate conductively connected to the first metal layer;
   a first semiconductor element including on front and rear surfaces thereof a plurality of metal electrodes;
   a first insulating member disposed on a side surface of the first semiconductor element;
   a second insulating member disposed on the first insulating member and on the first semiconductor element; and
   a third metal layer, in which at least one portion thereof is disposed on the second insulating member and which conductively connects the metal electrode of the first semiconductor element and the second metal layer on the insulated circuit substrate.

2. The semiconductor device according to claim 1, wherein
   the metal plate has a first through hole,
   at least one of the metal electrodes of the first semiconductor element is disposed in a position blocking the first through hole, and
   a fourth metal layer that conductively connects the first semiconductor element and the first metal layer is disposed inside the first through hole.

3. The semiconductor device according to claim 1, wherein a thickness of the third metal layer is 10 µm or more, and 200 µm or less.

4. The semiconductor device according to claim 3, wherein the third metal layer includes at least one element selected from the group consisting of copper, aluminum, titanium, tungsten, nickel, carbon, gold, or silver, or an alloy including these elements.

5. The semiconductor device according to claim 1, wherein a thickness of the second insulating member on the first semiconductor element is 10 µm or more, and 200 µm or less.

6. The semiconductor device according to claim 5, wherein the second insulating member is a polyimide resin.

7. The semiconductor device according to claim 1, wherein the third metal layer is conductively connected to the second metal layer across a terminal connecting metal plate.

8. The semiconductor device according to claim 1, wherein
   the metal plate includes a plurality of first through holes,
   the semiconductor device further comprises a second semiconductor element including on front and rear surfaces thereof a plurality of metal electrodes, wherein at least one of the metal electrodes is disposed in a position blocking the first through hole, and the third metal layer is directly connected to each of the metal electrode of the first semiconductor element and another metal electrode of the second semiconductor element.

9. The semiconductor device according to claim 8, further comprising:

a third insulating member disposed on the third metal layer;

a third semiconductor element disposed on the third insulating member and including on an upper surface thereof a plurality of metal electrodes;

a fourth insulating member disposed on the third semiconductor element and covering a surface of the third semiconductor element on which the metal electrode is not formed;

a fourth metal layer that directly conductively connects the metal electrode of the third semiconductor element and the third metal layer across the third insulating member and the fourth insulating member; and a fifth metal layer that directly conductively connects the metal electrode of the third semiconductor element and the metal electrode of the first semiconductor element across the second insulating member, the third insulating member, and the fourth insulating member.

\* \* \* \* \*

UNITED STATES PATENT AND TRADEMARK OFFICE
CERTIFICATE OF CORRECTION

PATENT NO. : 9,741,587 B2  
APPLICATION NO. : 15/205596  
DATED : August 22, 2017  
INVENTOR(S) : Tsunehiro Nakajima et al.

Page 1 of 1

It is certified that error appears in the above-identified patent and that said Letters Patent is hereby corrected as shown below:

In the Specification

Please change Column 5, Line 65, from "... Avoid forming ..." to --... A void forming ...--.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*